(12) United States Patent
Lee et al.

(10) Patent No.: US 11,001,504 B2
(45) Date of Patent: May 11, 2021

(54) COMPOUND SEMICONDUCTOR AND MANUFACTURING METHOD THEREOF

(71) Applicant: LG CHEM, LTD., Seoul (KR)

(72) Inventors: Jae-Ki Lee, Daejeon (KR); Tae-Hoon Kim, Daejeon (KR); Cheol-Hee Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 24 days.

(21) Appl. No.: 15/515,120

(22) PCT Filed: Sep. 25, 2015

(86) PCT No.: PCT/KR2015/010192
§ 371 (c)(1),
(2) Date: Mar. 28, 2017

(87) PCT Pub. No.: WO2016/052948
PCT Pub. Date: Apr. 7, 2016

(65) Prior Publication Data
US 2017/0217783 A1    Aug. 3, 2017

(30) Foreign Application Priority Data
Sep. 29, 2014    (KR) .................. 10-2014-0130569

(51) Int. Cl.
*C01F 17/30*    (2020.01)
*H01L 35/14*    (2006.01)
(Continued)

(52) U.S. Cl.
CPC .............. *C01F 17/30* (2020.01); *C22C 1/007* (2013.01); *C22C 12/00* (2013.01);
(Continued)

(58) Field of Classification Search
CPC ......... H01L 35/00; H01L 35/16; H01L 35/18; H01L 35/22; H01L 35/34; H01L 31/032; H01L 21/02156; H01L 21/02192
See application file for complete search history.

(56) References Cited

U.S. PATENT DOCUMENTS 6,207,888 B1 *   3/2001   Nolas .................. H01L 35/18
                                                      136/236.1
2005/0123431 A1   6/2005   He et al.
(Continued)

FOREIGN PATENT DOCUMENTS

CN    1861821 A  *  11/2006
EP    2708504 A1  *   3/2014 ........... C01G 51/006

OTHER PUBLICATIONS

L. Deng, X.P. Jia, T.C. Su, K. Jie, X. Guo, H.A. Ma, "The thermoelectric properties of In0.5Co4Sb12-xGex alloys prepared by HPHT", Materials Letters, vol. 68, Feb. 1, 2012, pp. 314-316 (Year: 2012).*

(Continued)

*Primary Examiner* — Mayla Gonzalez Ramos

(57) ABSTRACT

Disclosed is a compound semiconductor material with excellent performance and its utilization. The compound semiconductor may be expressed by Chemical Formula 1 below:

$$M1_a Co_4 Sb_{12-x} M2_x \qquad \text{Chemical Formula 1}$$

where M1 and M2 are respectively at least one selected from In and a rare earth metal element, $0 \le a \le 1.8$, and $0 \le x \le 0.6$.

17 Claims, 2 Drawing Sheets

(51) Int. Cl.
*H01L 35/34* (2006.01)
*H01L 21/02* (2006.01)
*H01L 31/0224* (2006.01)
*H01L 35/00* (2006.01)
*C22C 1/00* (2006.01)
*C22C 12/00* (2006.01)

(52) U.S. Cl.
CPC .. *H01L 21/02156* (2013.01); *H01L 21/02192* (2013.01); *H01L 31/022425* (2013.01); *H01L 35/14* (2013.01); *H01L 35/34* (2013.01); *H01L 35/00* (2013.01)

(56) References Cited

U.S. PATENT DOCUMENTS

| 2005/0229963 | A1* | 10/2005 | He | H01L 35/18 136/236.1 |
| 2009/0208364 | A1* | 8/2009 | Berardan | H01L 35/14 420/581 |
| 2010/0288967 | A1 | 11/2010 | Subramanian et al. | |
| 2013/0009117 | A1 | 1/2013 | Park et al. | |

OTHER PUBLICATIONS

Lili Xi, Jiong Yang Caifei Lu, Zhigang Mei, Wenqing Zhang, and Lidong Chen, "Systematic Study of the Multiple-Element Filling in Caged Skutterudite CoSb3", Chem. Mater. 2010, 22, 2384-2394 (Year: 2009).*

Machine Translation of CN-1861821-A. (Year: 2006).*

Yinglu Tang, Yuting Qiu, Lili Xi, Xun Shi, Wenqing Zhang, Lidong Chen, Ssu-Ming Tseng, Sinn-wen Chen and G. Jeffrey Snyder," Phase diagram of In—Co—Sb system and thermoelectric properties of In-containing skutterudites", Energy Environ. Sci., 2014, 7, 812 (Year: 2013).*

J. Y. Peng, P. N. Alboni, J. He, B. Zhang, Z. Su, T. Holgate, N. Gothard, and T. M. Tritt, "Thermoelectric properties of (In,Yb) double-filled CoSb3 skutterudite", Journal of Applied Physics 104, 053710 (Year: 2008).*

International Search Report for PCT/KR2015/010192 filed on Sep. 25, 2015.

Bo Duan et al., "Beneficial effect of Se substitution on thermoelectric properties of $Co_4Sb_{11.9-x}Te_xSe_{0.1}$ skutterudites", Journal of Solid State Chemistry, 2012, pp. 8-12, vol. 193, Elsevier Inc.

L. Deng et al., "The thermoelectric properties of $In_{0.5}Co_4Sb_{12-x}Ge_x$ alloys prepared by HPHT", Materials Letters, 2012, pp. 314-316, vol. 68, Elsevier B.V.

L. Deng et al., "The thermoelectric properties of $Co_4Sb_{12-x}Te_x$ synthesized at different pressure", Materials Letters, 2011, pp. 1057-1059, vol. 65, Elsevier B.V.

Lamberton, et al., "High Figure of Merit in Eu-Filled CoSb3-Based Skutterudites," Applied Physics Letters (AIP), 2002, vol. 80 (4), pp. 598-600.

Peng, et al., "Thermoelectric Properties of (In,Yb) Double-Filled CoSb3 Skutterudite," Journal of Applied Physics (AIP), 2008, vol. 104 (5), pp. 5.

* cited by examiner

| TEMPERATURE (°C) | ELECTRIC CONDUCTIVITY (S/cm) | | SEEBECK COEFFICIENT (µV/K) | | POWER FACTOR (µW/cm/K²) | |
|---|---|---|---|---|---|---|
| | COMPARATIVE EXAMPLE | EXAMPLE 1 | COMPARATIVE EXAMPLE | EXAMPLE 1 | COMPARATIVE EXAMPLE | EXAMPLE 1 |
| 50 | 1210 | 1366 | -171 | -174 | 35 | 41 |
| 100 | 1024 | 1240 | -194 | -182 | 38 | 41 |
| 200 | 854 | 1055 | -218 | -206 | 40 | 44 |

COMPOUND SEMICONDUCTOR AND MANUFACTURING METHOD THEREOF

TECHNICAL FIELD

The present application claims priority to Korean Patent Application No. 10-2014-0130569 filed on Sep. 29, 2014 in the Republic of Korea, the disclosures of which are incorporated herein by reference.

The present application is a National Stage of International Patent Application No. PCT/KR2015/010192, filed on Sep. 25, 2015, which claims priority to Korean Patent Application No. 10-2014-0130569 filed on Sep. 29, 2014 in the Republic of Korea, the disclosures of which are incorporated herein by reference.

BACKGROUND ART

A compound semiconductor is a compound that is composed of at least two types of elements rather than one type of element such as silicon or germanium and operates as a semiconductor. Various types of compound semiconductors have been developed and are currently being used in various fields of industry. Typically, a compound semiconductor may be used in thermoelectric conversion devices using the Peltier Effect, light emitting devices using the photoelectric conversion effect, for example, light emitting diodes or laser diodes, fuel cells, and the like.

In particular, when being used for a thermoelectric conversion device, the compound semiconductor may be called a thermoelectric material, and this thermoelectric material may be applied to a thermoelectric conversion power plant or a thermoelectric conversion cooling device in the form of a thermoelectric conversion device. Generally, the thermoelectric conversion device includes an N-type thermoelectric materials and a P-type thermoelectric materials electrically connected in series and thermally connected in parallel. Here, the thermoelectric conversion power generation is a method which generates power by converting thermal energy to electrical energy using a thermoelectromotive force generated by creating a temperature difference in a thermoelectric conversion device. Also, the thermoelectric conversion cooling is a method which produces cooling by converting electrical energy to thermal energy using an effect that a temperature difference creates between both ends of a thermoelectric conversion device when a direct current flows through the both ends of the thermoelectric conversion device.

The energy conversion efficiency of the thermoelectric conversion device generally depends on a performance index value or ZT of a thermoelectric conversion material, and as the ZT value higher, the thermoelectric conversion material may be regarded as having more excellent performance. Here, the ZT may be determined based on the Seebeck coefficient, electrical conductivity. In more detail, the ZT is proportional to a square of Seebeck coefficient and electric conductivity and is inversely proportional to thermal conductivity. Therefore, in order to enhance energy conversion efficiency of the thermoelectric conversion device, it is required to develop a thermoelectric conversion material having a high Seebeck coefficient, high electric conductivity or low thermal conductivity.

Even though many kinds of thermoelectric conversion materials have been proposed until now, it cannot be regarded that a thermoelectric conversion material ensuring a sufficient ZT value is proposed. In particular, a Skutterudite thermoelectric material is a representative example of the thermoelectric material and is being studied actively. However, the Skutterudite thermoelectric material cannot also be regarded as having sufficient thermoelectric conversion performance due to high thermal conductivity. Therefore, for the thermoelectric material, there is a continuous demand on the development of a thermoelectric conversion material with excellent thermoelectric conversion performance, in order to enhance the energy conversion efficiency of the thermoelectric conversion device.

DISCLOSURE

Technical Problem

The present disclosure is designed to solve the above problem, and therefore, the present disclosure is directed to providing a Skutterudite-based compound semiconductor material, which may have excellent thermoelectric conversion performance and be utilized for various purposes such as thermoelectric conversion material of a thermoelectric conversion device, a solar cell or the like, its manufacturing method, and a thermoelectric conversion device or a solar cell using the same.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect, after repeated studies of a compound semiconductor, inventors of the present disclosure have successfully synthesized a compound semiconductor represented by Chemical Formula 1, and found that this compound can be used for a thermoelectric conversion material of a thermoelectric conversion device or a light absorption layer of a solar cell.

$$M1_a Co_4 Sb_{12-x} M2_x \qquad \text{Chemical Formula 1}$$

In Chemical Formula 1, M1 and M2 are respectively at least one selected from In and a rare earth metal element, $0 \leq a \leq 1.8$, and $0 < x \leq 0.6$.

Here, in Chemical Formula 1, at least one of M1 and M2 may essentially include at least one of Ce and Yb as a rare earth metal element.

In addition, in Chemical Formula 1, at least one of M1 and M2 may essentially include In.

In addition, in Chemical Formula 1, M1 and M2 may include both In and a rare earth element.

In addition, in Chemical Formula 1, a may be in the range of $0 < a \leq 1.0$.

In addition, in Chemical Formula 1, x may be in the range of $0 < x \leq 0.4$.

In another aspect of the present disclosure, there is also provided a manufacturing method of a compound semiconductor, comprising: forming a mixture by weighing and mixing at least one of In and a rare earth metal element together with Co and Sb to correspond to Chemical Formula 1; and thermally treating the mixture to form a composite.

Here, the mixture may essentially include at least one of Ce and Yb as a rare earth metal element.

In addition, the manufacturing method of the compound semiconductor may further comprise: press-sintering the composite.

In addition, when forming the mixture, a compound of a rare earth metal element and Sb may be synthesized in advance and then mixed with other materials.

In another aspect of the present disclosure, there is also provided a thermoelectric conversion device, comprising the compound semiconductor according to the present disclosure.

In another aspect of the present disclosure, there is also provided a solar cell, comprising the compound semiconductor according to the present disclosure.

In another aspect of the present disclosure, there is also provided a bulk thermoelectric material, comprising the compound semiconductor according to the present disclosure.

Advantageous Effects

According to the present disclosure, a compound semiconductor material which may be used for a thermoelectric conversion device or a solar cell is provided.

Further, the new compound semiconductor according to the present disclosure may replace a conventional compound semiconductor or may be used as another material in addition to the conventional compound semiconductor.

In addition, according to an embodiment of the present disclosure, the compound semiconductor may be used as a thermoelectric conversion material of a thermoelectric conversion device. In this case, a high ZT value is ensured, and thus a thermoelectric conversion device with excellent thermoelectric conversion performance may be manufactured.

In particular, the thermoelectric material according to an embodiment of the present disclosure may improve electric characteristics, for example electric conductivity, by doping an In and rare earth metal element and also reduce thermal conductivity by means of a rattler.

In addition, in another aspect of the present disclosure, the compound semiconductor may be used for a solar cell. Particularly, the compound semiconductor of the present disclosure may be used as a light absorption layer of the solar cell.

Moreover, in another aspect of the present disclosure, the compound semiconductor may be used for an IR window which selectively passes IR, an IR sensor, a magnetic device, a memory or the like.

DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

The present disclosure provides a new compound semiconductor represented by Chemical Formula 1 below.

$$M1_a Co_4 Sb_{12-x} M2_x \qquad \text{Chemical Formula 1}$$

In Chemical Formula 1, M1 and M2 are respectively at least one selected from In and a rare earth metal element. In other words, in Chemical Formula 1, M1 may be In and/or a rare earth metal element, and M2 may also be In and/or a rare earth metal element.

In addition, in Chemical Formula 1, a and x may be in the range of $0 \leq a \leq 1.8$ and $0 < x \leq 0.6$.

In Chemical Formula 1, at least one of M1 and M2 may essentially include at least one of Ce and Yb as a rare earth metal element.

In addition, in Chemical Formula 1, at least one of M1 and M2 may essentially include In.

Further, in Chemical Formula 1, M1 and M2 may include both In and a rare earth element.

In addition, in Chemical Formula 1, a may be in the range of $0 < a \leq 1.0$.

In addition, in Chemical Formula 1, x may be in the range of $0 < x \leq 0.4$.

In particular, in Chemical Formula 1, at least one of M1 and M2 may include at least one lanthanum-based element as a rare earth metal element.

Preferably, in more detail, the compound semiconductor according to the present disclosure may be expressed as Chemical Formula 2 below.

$$In_{a1} R_{a2} Co_4 Sb_{12-x1-x2} In_{x1} R_{x2} \qquad \text{Chemical Formula 2}$$

In Chemical Formula 2, R is at least one of rare earth metal elements, $0 \leq a1 < 0.9$, $0 \leq a2 \leq 0.9$, $0 \leq x1 \leq 0.3$, $0 \leq x2 \leq 0.3$ and $0 < x1+x2$.

Preferably, in Chemical Formula 2, R may include at least one of Ce and Yb.

In particular, the compound semiconductor according to the present disclosure may be configured so that Sb sites are partially deficient at a Co—Sb-based compound semiconductor and the deficiency site(s) is substituted with R which is In and/or a rare earth element. In addition, separate from such substitution, the compound semiconductor according to the present disclosure may be configured so that In and/or R is further added to the Co—Sb-based compound semiconductor. Here, the addition may be performed by filling In or R in pores present in a unit lattice of $CoSb_3$.

In addition, due to such structural features, the compound semiconductor according to the present disclosure may have improved thermoelectric conversion performance in comparison to an existing Co—Sb Skutterudite-based compound semiconductor. In particular, in the compound semiconductor according to the present disclosure, electric characteristics may be improved by means of In and R doping, and thermal conductivity may be lowered by means of a rattler.

For example, the substitution of In and/or R to a Sb deficiency site may increase a charge concentration and thus improve electric conductivity, and the addition of In and/or R may fill voids of lattice structure and thus lower lattice thermal conductivity by means of rattling.

Preferably, in Chemical Formula 2 a1 may be in the range of $0 \leq a1 \leq 0.6$. More preferably, in Chemical Formula 2, a1 may be in the range of $0 \leq a1 \leq 0.3$. In particular, in Chemical Formula 2, a1 may be in the range of $0 \leq a1 \leq 0.18$.

Also preferably, in Chemical Formula 2, a2 may be in the range of $0 \leq a2 \leq 0.4$. In particular, in Chemical Formula 2, a2 may be in the range of $0 \leq a2 \leq 0.3$. In addition, in Chemical Formula 2, a2 may be in the range of $0.05 \leq a2$. Further, in Chemical Formula 2, a2 may be in the range of $0.1 \leq a2$. In addition, in Chemical Formula 2, a2 may be in the range of $0.15 \leq a2$.

Also preferably, in Chemical Formula 2, x1 may be in the range of $0 \leq x1 \leq 0.2$. More preferably, in Chemical Formula 2, x1 may be in the range of $0 \leq x1 \leq 0.1$.

Also preferably, in Chemical Formula 2, x2 may be in the range of $0 \leq x2 \leq 0.2$. More preferably, in Chemical Formula 2, x2 may be in the range of, $0 \leq x2 \leq 0.1$.

For example, in Chemical Formula 2, a1 may be 0.18. In this case, the compound semiconductor according to the present disclosure may be expressed as $In_{0.18}R_{a2}Co_4Sb_{12-x1-x2}In_{x1}R_{x2}$.

In addition, in Chemical Formula 2, a2 may be 0. In this case, the compound semiconductor according to the present disclosure may be expressed as $In_{a1}Co_4Sb_{12-x1-x2}In_{x1}R_{x2}$.

Moreover, in Chemical Formula 2, a2 may be 0.09. In this case, the compound semiconductor according to the present disclosure may be expressed as $In_{a1}R_{0.09}Co_4Sb_{12-x1-x2}In_{x1}R_{x2}$.

In addition, in Chemical Formula 2, x1 may be 0.09. In this case, the compound semiconductor according to the present disclosure may be expressed as $In_{a1}R_{a2}Co_4Sb_{11.91-x2}In_{0.09}R_{x2}$.

In addition, in Chemical Formula 2, x2 may be 0. In this case, the compound semiconductor according to the present disclosure may be expressed as $In_{a1}R_{a2}Co_4Sb_{12-x1}In_{x1}$.

Moreover, in Chemical Formula 2, x2 may be 0.09. In this case, the compound semiconductor according to the present disclosure may be expressed as $In_{a1}R_{a2}Co_4Sb_{11.91-x1}In_{x1}R_{0.09}$.

Also preferably, when In is included, the compound semiconductor according to the present disclosure may be configured to have an interaction formula of $a1=2 \times 1$, in Chemical Formula 2. This is based on the experimental ground on solubility limit according to an added amount of In when Sb is deficient, and in a configuration conforming to this formula, the thermoelectric conversion performance may be effectively improved at the compound semiconductor according to the present disclosure.

For example, in Chemical Formula 2, it is possible that $a1=0.18$ and $a2=0.09$.

Also preferably, in Chemical Formula 2, $a1+a2>0$. In other words, the compound semiconductor according to the present disclosure may be configured so that In and/or R is substituted to a Sb site at a Co—Sb Skutterudite-based compound semiconductor, and also at least one of In and R fills pores of Co—Sb. In addition, in the configuration of the present disclosure, since pores present in the lattice structure are filled, lattice thermal conductivity may be lowered.

As described above, in the compound semiconductor according to the present disclosure, In and/or R may be added to a Co—Sb-based compound semiconductor, and also Sb may be partially substituted with In and/or R.

Therefore, due to such structural features, the compound semiconductor according to the present disclosure may have improved electric conductivity and effectively lowered thermal conductivity in comparison to an existing Co—Sb-based compound semiconductor, thereby enhancing thermoelectric conversion performance.

Figure 1:
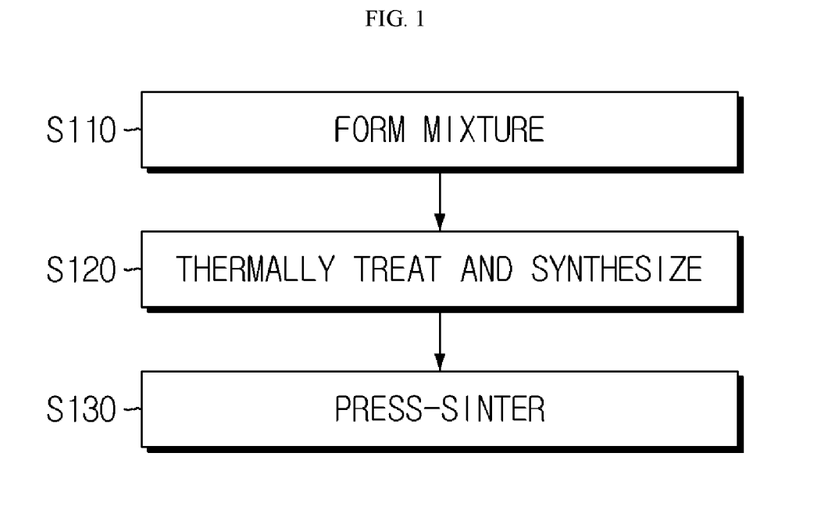
FIG. 1 is a flowchart for schematically illustrating a method for manufacturing a compound semiconductor according to an embodiment of the present disclosure.

FIG. 1 is a flowchart for schematically illustrating a method for manufacturing a compound semiconductor according to an embodiment of the present disclosure.

Referring to FIG. 1, a method for manufacturing a compound semiconductor according to the present disclosure may include a mixture forming step S110 and a composite forming step S120.

In the mixture forming step S110, In and/or a rare earth metal element is mixed with Co and Sb as raw material to correspond to Chemical Formula 1, thereby forming a mixture.

In particular, in Step S110, the mixture may essentially include at least one of Ce and Yb as a rare earth metal element.

Preferably, in Step S110, if the rare earth metal element is mixed, the rare earth metal element may be firstly synthesized with Sb so that other materials are mixed in a state where a compound is synthesized between the rare earth metal element and Sb. For example, in Step S110, if Yb is used as a rare earth metal element, Yb is not mixed solely, but Yb and Sb may be mixed first and then synthesized by means of thermal treatment to form a composite such as $YbSb_2$. In this case, in Step S110, $YbSb_2$ synthesized as above may be mixed with other materials such as Co, Sb, In or the like to form a mixture. In other words, the mixture formed in Step S110 may include an In and/or R—Sb compound together with Co and Sb. Here, the R—Sb compound may be regarded as meaning a compound formed by bonding R (rare earth metal element) to Sb, for example $RSb$, $RSb_2$, $RSb_3$, $RSb_4$, . . . .

The rare earth element (R) such as Yb may have difficulty in stoichiometric control since it causes severe reaction during a synthesizing process. However, if the R—Sb compound is prepared first and then In, Co and Sb are further added thereto in a stoichiometric manner as in this embodiment, it is possible to prevent the above problem, and the compound semiconductor according to the present disclosure may be manufactured more easily.

In this embodiment, if R is included as raw material, for example if a compound semiconductor of $x2>0$ is manufactured in Chemical Formula 2, Step S110 may include the steps of synthesizing a R—Sb compound, and mixing the synthesized R—Sb compound with Co and Sb and selectively adding In thereto to form a mixture.

Here, the R—Sb compound such as $YbSb_2$ may be synthesized by means of solid state reaction (SSR). In the solid state reaction, at least a part of raw materials used in the synthesis, for example Yb, may not be changed into a liquid state during the synthesizing process, but the reaction may be performed in a solid state. At this time, $YbSb_2$ may be synthesized by charging Yb powder and Sb powder into a graphite crucible, performing Ar purging and vacuum-sealing to a fused silica tube and allowing reaction at a predetermined temperature for predetermined time. For example, $YbSb_2$ may be prepared in advance by allowing Yb and Sb to react with a heating rate of 2° C./min at 650° C. for 12 hours.

Meanwhile, Step S110 may be performed by mixing powder-form raw materials (In, R—Sb compound, Co, Sb). In this case, the raw materials may be mixed more easily, and thus the compound may be more easily synthesized in Step S120 due to improved reactivity.

In addition, in the mixture forming step S110, raw materials may be mixed by means of hand milling using mortar, ball milling, planetary ball mill or the like, but the present disclosure is not limited to any specific mixing method.

In the composite forming step S120, the mixture formed in Step S110 is thermally treated to form a composite according to Chemical Formula 1, in more detail, according to Chemical Formula 2. For example, in Step S120, $In_{a1}R_{a2}Co_4Sb_{12-x1-x2}In_{x1}R_{x2}$ ($0 \leq a1 \leq 0.9$, $0 \leq a2 \leq 0.9$, $0 \leq x1 \leq 0.3$, $0 \leq x2 \leq 0.3$, $0 < x1+x2$) compound may be synthesized. Here, in Step S120, the mixture of Step S110 may be put into a furnace and heated at a predetermined temperature for predetermined time so that the compound of Chemical Formula 1 is synthesized.

Preferably, Step S120 may be performed by means of solid state reaction. For example, Step S120 may be performed in a temperature range of 200° C. to 650° C. for 1 to 24 hours. The temperature range is lower than a melting point of Yb or Co, and thus these elements may be synthesized in a non-melted state. For example, Step S120 may be performed under a temperature condition of 650° C. for 12 hours.

In Step S120, in order to synthesize $In_{a1}R_{a2}Co_4Sb_{12-x1-x2}In_{x1}R_{x2}$, the mixture of In, Co, Sb, R—Sb compound or the like may be formed into a pellet shape at normal temperature, and the pellet-shaped mixture may be put into a fused silica tube and purged with an inert gas, for example Ar-purged, and vacuum-sealed. In addition, the vacuum-sealed mixture may be put into a furnace and thermally treated.

Preferably, the method for manufacturing a compound semiconductor according to the present disclosure may further include press-sintering the composite (S130) after the composite forming step.

Here, Step S130 may be performed by means of hot pressing (HP) or spark plasma sintering (SPS). When the thermoelectric material according to the present disclosure is sintered by means of such a press-sintering method, high sintering density and improved thermoelectric performance may be obtained easily.

For example, the press-sintering step may be performed under a pressure condition of 30 MPa to 200 MPa. In addition, the press-sintering step may be performed under a temperature condition of 300° C. to 800° C. In addition, the press-sintering step may be performed under the above pressure and temperature conditions for 1 minute to 12 hours.

In addition, Step S130 may be performed in a vacuum state or in a state where a gas such as Ar, He, $N_2$ containing hydrogen partially or not containing hydrogen flows.

Also preferably, Step S130 may be performed so that the composite prepared in Step S120 is pulverized into a powder form and then is press-sintered. In this case, the sintering and measuring processes may be performed more conveniently, and the sintering density may be improved further.

The compound semiconductor may have different thermoelectric performance depending on its manufacturing method, and the compound semiconductor according to the present disclosure may be manufactured using the above compound semiconductor manufacturing method. In this case, the compound semiconductor may increase high electric conductivity, lower thermal conductivity and ensure a high ZT value.

However, the present disclosure is not limited to the above manufacturing method, and the compound semiconductor of Chemical Formula 1 may also be manufactured using another method.

A thermoelectric conversion device according to the present disclosure may include the compound semiconductor described above. In other words, the compound semiconductor according to the present disclosure may be used as a thermoelectric conversion material for the thermoelectric conversion device.

The compound semiconductor according to the present disclosure has low thermal conductivity, high electric conductivity and a large ZT value. Therefore, the compound semiconductor according to the present disclosure may replace a conventional thermoelectric conversion material or may be used for a thermoelectric conversion device in addition to the conventional compound semiconductor.

In addition, the compound semiconductor according to the present disclosure may be applied to a bulk-type thermoelectric conversion material. In other words, the bulk-type thermoelectric material according to the present disclosure includes the compound semiconductor described above.

In addition, a solar cell according to the present disclosure may include the compound semiconductor above. In other words, the compound semiconductor according to the present disclosure may be used for a solar cell, particularly as a light absorption layer of the solar cell.

The solar cell may be produced in a structure where a front surface transparent electrode, a buffer layer, a light absorption layer, a rear surface electrode and a substrate are laminated in order from the side where a solar ray is incident. The substrate located at the lowest portion may be made of glass, and the rear surface electrode on the entire surface thereof may be formed by depositing metal such as Mo.

Subsequently, the compound semiconductor according to the present disclosure may be laminated on the rear surface electrode by means of an electron beam deposition method, a sol-gel method, or a PLD (Pulsed Laser Deposition) to form the light absorption layer. On the light absorption layer, a buffer layer for buffering the difference in lattice constants and band gaps between a ZnO layer serving as the front surface transparent electrode and the light absorption layer may be present. The buffer layer may be formed by depositing a material such as CdS by means of CBD (Chemical Bath Deposition) or the like. Next, the front surface transparent electrode may be formed on the buffer layer by means of sputtering or the like as a ZnO film or a ZnO and ITO laminate.

The solar cell according to the present disclosure may be modified in various ways. For example, it is possible to manufacture a tandem solar cell where a solar cell using the compound semiconductor according to the present disclosure as the light absorption layer is laminated. In addition, the solar cell laminated as described above may employ a solar cell using silicon or another known compound semiconductor.

In addition, it is possible to change a band gap of the compound semiconductor according to the present disclosure and laminate a plurality of solar cells which use compound semiconductors having different band gaps as the light absorption layer.

In addition, the compound semiconductor according to the present disclosure may also be applied to IR windows which selectively pass IR or IR sensors.

Hereinafter, the present disclosure will be described in detail through examples and comparative examples. The examples of the present disclosure, however, may take several other forms, and the scope of the present disclosure should not be construed as being limited to the following examples. The examples of the present disclosure are provided to more fully explain the present disclosure to those having ordinary knowledge in the art to which the present disclosure pertains.

Example 1

In, Co, Sb powder were prepared as reagents and weighed to have a composition of $In_{0.18}Co_4Sb_{11.91}In_{0.09}$ by mole fractions, and then a mixture was prepared therefrom using mortar. At this time, the mixture was prepared in a glove box filled with Ar.

The mixed materials were formed into a pellet shape at normal temperature, and the pellet-shaped mixture was put into a fused silica tube, purged with an inert gas (Ar) and vacuum-sealed, and then heated at 600° C. for 12 hours, thereby performing a synthesizing reaction.

The reagent synthesized as above in Example 1 was sintered at 600° C. for 10 minutes by means of a spark plasma sintering (SPS) system (SPS211Lx, Fuji).

Figure 2:
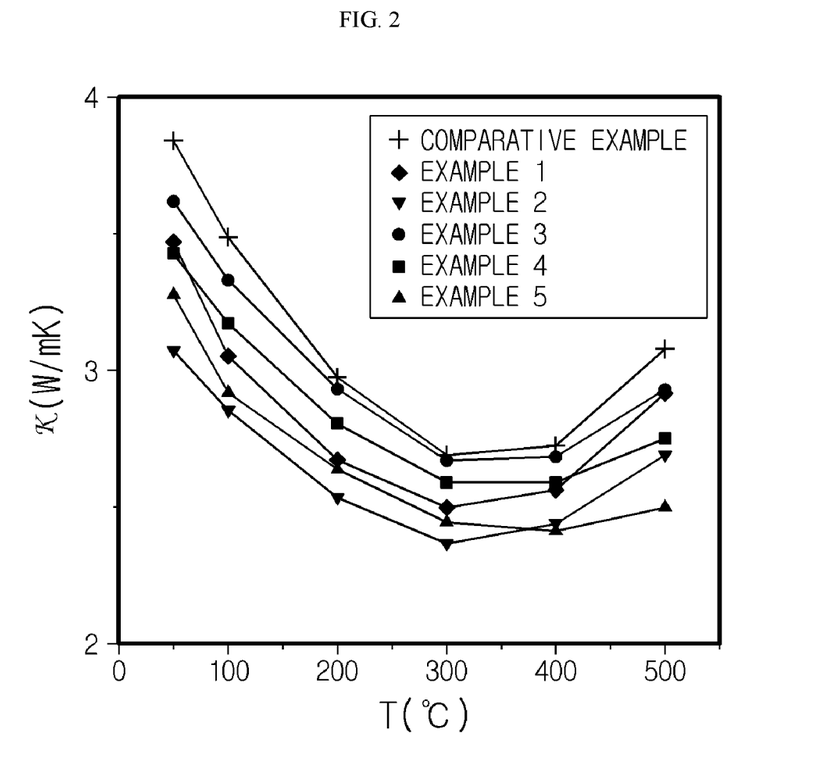
FIG. 2 is a graph showing thermal conductivity according to a temperature change of compound semiconductors according to the example according to the present disclosure and the comparative example.
Figure 3:
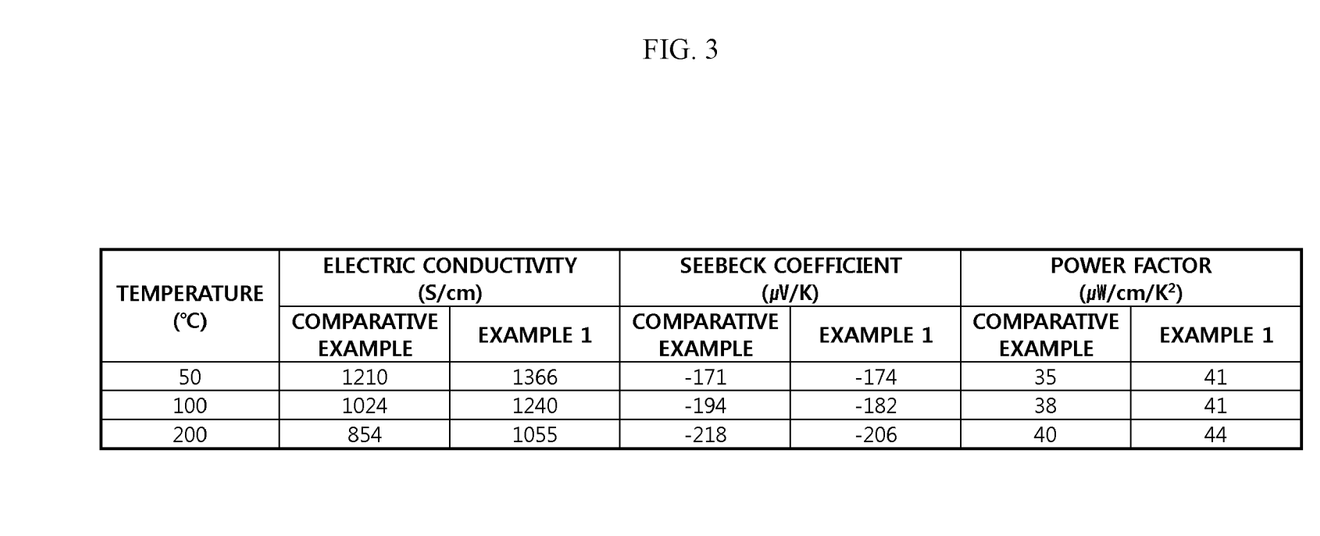
FIG. 3 is a table showing electric conductivity, Seebeck coefficient and power factor of compound semiconductors prepared according to examples of the present disclosure and a comparative example, depending on a temperature change.

The sintered reagent was processed into a disk shape, and its thermal diffusion coefficient was measured by means of LFA457 (Netzsch) at predetermined temperature intervals, and thermal conductivity (κ) of the reagent was calculated using an interaction formula of specific heat and density (thermal conductivity=density*specific heat*thermal diffusion coefficient). The calculation result is depicted in FIG. 2 as Example 1. In addition, the sintered reagent of Example 1 was processed into a bar shape, and its electric conductivity and Seebeck coefficient were measured using ZEM-3 (Ulvac-Rico, Inc.), and a power factor was calculated therefrom. It is depicted in FIG. 3 as Example 1.

Example 2

First, Yb and Sb powder were prepared and mixed, then were charged into a graphite crucible, put into a fused silica tube, Ar-purged and vacuum-sealed, and then heated with a heating rate of 2° C./min at 650° C. for 12 hours, thereby preparing $YbSb_2$.

In addition, In, Co, Sb powder were further added to $YbSb_2$ prepared as above to have a composition of $In_{0.18}Yb_{0.09}Co_4Sb_{11.82}In_{0.09}Yb_{0.09}$ by mole fractions, and they were mixed to prepare a mixture. At this time, the mixture was prepared in a glove box filled with Ar.

The mixed materials were formed into a pellet shape at normal temperature, similar to Example 1. In addition, the pellet-shaped mixture was put into a fused silica tube, purged with an inert gas (Ar) and vacuum-sealed, and then heated at 600° C. for 12 hours, thereby performing a reaction.

The reagent synthesized as above in Example 2 was sintered in the same way as Example 1, and its thermal conductivity was measured in the same way. The measurement result is depicted in FIG. 2 as Example 2.

Example 3

First, Ce and Sb powder were prepared and mixed, then were charged into a graphite crucible, put into a fused silica tube, Ar-purged and vacuum-sealed, and then heated with a heating rate of 2° C./min at 650° C. for 12 hours, thereby preparing $CeSb_2$.

In addition, In, Co, Sb powder were further added to $CeSb_2$ prepared as above to have a composition of $In_{0.18}Ce_{0.05}Co_4Sb_{11.91}In_{0.09}$ by mole fractions, and they were mixed to prepare a mixture. At this time, the mixture was prepared in a glove box filled with Ar.

The mixed materials were formed into a pellet shape at normal temperature, similar to Example 1. In addition, the pellet-shaped mixture was put into a fused silica tube, purged with an inert gas (Ar) and vacuum-sealed, and then heated at 600° C. for 12 hours, thereby performing a reaction.

The reagent synthesized as above in Example 3 was sintered in the same way as Example 1, and its thermal conductivity was measured in the same way. The measurement result is depicted in FIG. 2 as Example 3.

Example 4

First, Ce and Sb powder were prepared and mixed, then were charged into a graphite crucible, put into a fused silica tube, Ar-purged and vacuum-sealed, and then heated with a heating rate of 2° C./min at 650° C. for 12 hours, thereby preparing $CeSb_2$.

In addition, In, Co, Sb powder were further added to $CeSb_2$ prepared as above to have a composition of $In_{0.18}Ce_{0.1}Co_4Sb_{11.91}In_{0.09}$ by mole fractions, and they were mixed to prepare a mixture. At this time, the mixture was prepared in a glove box filled with Ar.

The mixed materials were formed into a pellet shape at normal temperature, similar to Example 1. In addition, the pellet-shaped mixture was put into a fused silica tube, purged with an inert gas (Ar) and vacuum-sealed, and then heated at 600° C. for 12 hours, thereby performing a reaction.

The reagent synthesized as above in Example 4 was sintered in the same way as Example 1, and its thermal conductivity was measured in the same way. The measurement result is depicted in FIG. 2 as Example 4.

Example 5

First, Ce and Sb powder were prepared and mixed, then were charged into a graphite crucible, put into a fused silica tube, Ar-purged and vacuum-sealed, and then heated with a heating rate of 2° C./min at 650° C. for 12 hours, thereby preparing $CeSb_2$.

In addition, In, Co, Sb powder were further added to $CeSb_2$ prepared as above to have a composition of $In_{0.18}Ce_{0.15}Co_4Sb_{11.91}In_{0.09}$ by mole fractions, and they were mixed to prepare a mixture. At this time, the mixture was prepared in a glove box filled with Ar.

The mixed materials were formed into a pellet shape at normal temperature, similar to Example 1. In addition, the pellet-shaped mixture was put into a fused silica tube, purged with an inert gas (Ar) and vacuum-sealed, and then heated at 600° C. for 12 hours, thereby performing a reaction.

The reagent synthesized as above in Example 5 was sintered in the same way as Example 1, and its thermal conductivity was measured in the same way. The measurement result is depicted in FIG. 2 as Example 5.

COMPARATIVE EXAMPLE

In, Co, Sb powder were prepared as reagents and weighed to have a composition of $In_{0.18}Co_4Sb_{12}$ by mole fractions, and then a mixture was prepared therefrom. At this time, the mixture was prepared in a glove box filled with Ar.

In addition, the prepared mixture was thermally treated and sintered in the same way as Example 1.

For the synthesized and sintered reagent of the Comparative Example, thermal conductivity was measured in the same way as Example 1. The measurement result is depicted in FIG. 2 as Comparative Example. In addition, for the reagent of the Comparative Example, electric conductivity and Seebeck coefficient were measured in the same way as Example 1, and a power factor was calculated therefrom. It is depicted in FIG. 3 as Comparative Example.

First, seeing the results of FIG. 2, it may be found that the compound semiconductors of Examples 1 to 5 according to the present disclosure has lower average thermal conductivity in a temperature range of 50° C. to 500° C. in comparison to the compound semiconductor of the Comparative Example.

In more detail, it may be found that the compound semiconductor of Example 1 in which In is further added in addition to Co and Sb and also In is doped at a Sb deficiency site has lower thermal conductivity in the entire temperature range of 50° C. to 500° C., in comparison to the compound semiconductor of the Comparative Example. In more detail, it may be found that in the compound semiconductor of Example 1, average thermal conductivity is reduced by about 4% in the entire temperature range of 50° C. to 500° C., in comparison to the compound semiconductor of the Comparative Example.

Further, in the compound semiconductor of Example 2, In and Yb are further added in addition to Co and Sb, and In and Yb are doped at a Sb deficiency site, and it may be found that thermal conductivity is greatly lowered in the entire temperature range of 50° C. to 500° C., in comparison to the compound semiconductor of the Comparative Example. In addition, it may be found that in the compound semiconductor of Example 2 according to the present disclosure, the average thermal conductivity is reduced by about 15% in the entire measurement temperature range of 50° C. to 500° C., in comparison to the compound semiconductor of the Comparative Example. In particular, the compound semiconductor of Example 2 exhibits lowest thermal conductivity in a temperature range of 50° C. to 350° C.

In addition, it may be found that the compound semiconductors of Example 3 to 5 in which In and Ce are further added in addition to Co and Sb and also In is doped at a Sb deficiency site has greatly lower thermal conductivity in the entire measurement temperature range of 50° C. to 500° C., in comparison to the compound semiconductor of the Comparative Example. Further, when comparing Examples 3 to 5 with each other, it may be found that the thermal conductivity reduction effect is highest at Example 5 where Ce is added greatest. In particular, in a temperature range of 400° C. to 500° C., it may be found that Example 4 exhibits lowest thermal conductivity, and thus its effect is very excellent.

As described above, it may be found that Examples 2 to 5 have very excellent thermal conductivity reduction effect in comparison to the Comparative Example. It may be guessed that in Examples 2 to 5, a rare earth element filled in pores of a lattice or substituted to a Sb deficiency site plays a role of a phonon scattering center and thus lowers the lattice thermal conductivity.

In addition, seeing the results of FIG. 3, it may be found that the compound semiconductor of Example 1 according to the present disclosure has greatly improved electric conductivity at all temperatures of 50° C., 100° C. and 200° C. in comparison to the compound semiconductor of the Comparative Example. In addition, it may be found that Example 1 also has an improved power factor in comparison to the Comparative Example.

In conclusion, it may be understood that the compound semiconductor according to each example of the present disclosure has lower thermal conductivity and higher electric conductivity in comparison to the existing compound semiconductor of the Comparative Example. Therefore, the compound semiconductor according to the present disclosure may be regarded as having excellent thermoelectric conversion and so can be very useful as a thermoelectric conversion material.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. A compound semiconductor, expressed by Chemical Formula 1 below:

$$M1_aCo_4Sb_{12-x}M2_x \qquad \text{Chemical Formula 1}$$

where $M_1$ is at least one selected from In and a rare earth metal element and $M_2$ includes both In and a rare earth metal element, $M_2$ being substituted to a Sb site, wherein $0 \leq a \leq 1.8$, and $0 < x \leq 0.4$.

2. The compound semiconductor according to claim 1, wherein in Chemical Formula 1, a is greater than zero, and $M_1$ includes both In and a rare earth element.

3. The compound semiconductor according to claim 1, wherein in Chemical Formula 1, a is in the range of $0 < a \leq 1.0$.

4. A manufacturing method of the compound semiconductor defined in claim 1, the manufacturing method comprising:
forming a mixture by weighing and mixing at least one of In and a rare earth metal element together with Co and Sb to correspond to Chemical Formula 1 of claim 1; and
thermally treating the mixture to form a composite.

5. The manufacturing method of the compound semiconductor according to claim 4, after forming the composite, further comprising:
press-sintering the composite.

6. The manufacturing method of the compound semiconductor according to claim 4,
wherein when forming the mixture, a compound of the rare earth metal element and Sb is synthesized in advance and then mixed with other materials.

7. A thermoelectric conversion device, comprising the compound semiconductor defined in claim 1.

8. A solar cell, comprising the compound semiconductor defined in claim 1.

9. A bulk thermoelectric material, comprising the compound semiconductor defined in claim 1.

10. The compound semiconductor according to claim 1, having the formula $In_{a1}R_{a2}Co_4Sb_{12-x1-x2}In_{x1}R_{x2}$, in which R is the rare earth element.

11. The compound semiconductor according to claim 10, wherein x1 is in the range of $0 \leq x1 \leq 0.2$.

12. The compound semiconductor according to claim 10, wherein $x_2$ is in the range of $0 \leq x2 \leq 0.2$.

13. The compound semiconductor according to claim 10, wherein x1 is in the range of $0 \leq x1 \leq 0.2$ and wherein x2 is in the range of $0 \leq x2 \leq 0.2$.

14. The compound semiconductor according to claim 1, wherein the rare earth element is selected from Ce and Yb.

15. The compound semiconductor according to claim 1, wherein the rare earth element is Yb.

16. The compound semiconductor according to claim 1, wherein the indium is present in M1 and M2 in a ratio of 2:1.

17. The compound semiconductor according to claim 1, wherein M1 includes the rare earth element, and the rare earth element of M1 is present in a different amount from the In present in M1.

* * * * *